United States Patent
Peng et al.

(10) Patent No.: US 9,419,101 B1
(45) Date of Patent: Aug. 16, 2016

(54) MULTI-LAYER SPACER USED IN FINFET

(71) Applicant: GLOBALFOUNDRIES Inc., Grand Cayman (KY)

(72) Inventors: Jianwei Peng, Albany, NY (US); Hong Yu, Rexford, NY (US); Zhao Lun, Ballston Lake, NY (US); Tao Han, Clifton Park, NY (US); Hsien-Ching Lo, Clifton Park, NY (US); Basab Banerjee, Ballston Lake, NY (US); Wen Zhi Gao, Rexford, NY (US); Byoung-Gi Min, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/932,394

(22) Filed: Nov. 4, 2015

(51) Int. Cl.
*H01L 21/8232* (2006.01)
*H01L 29/66* (2006.01)
*H01L 29/78* (2006.01)
*H01L 27/108* (2006.01)
*H01L 27/088* (2006.01)
*H01L 21/8234* (2006.01)

(52) U.S. Cl.
CPC ...... *H01L 29/6656* (2013.01); *H01L 29/66545* (2013.01); *H01L 29/66795* (2013.01); *H01L 29/785* (2013.01); *H01L 21/823431* (2013.01); *H01L 27/0886* (2013.01); *H01L 27/10879* (2013.01)

(58) Field of Classification Search
CPC ............... H01L 21/823431; H01L 27/0886; H01L 27/10879; H01L 29/66795
USPC .................. 257/288; 438/300, 197
See application file for complete search history.

(56) References Cited

U.S. PATENT DOCUMENTS

| 9,123,826 B1 * | 9/2015 | Harley | H01L 29/04 |
| 2013/0277686 A1 * | 10/2013 | Liu | H01L 29/6653 257/77 |
| 2014/0327055 A1 * | 11/2014 | Wang | H01L 29/4966 257/288 |
| 2015/0263122 A1 * | 9/2015 | Hsiao | H01L 29/515 257/401 |
| 2016/0020209 A1 * | 1/2016 | Anderson | H01L 27/0886 257/383 |

* cited by examiner

Primary Examiner — George Fourson, III
(74) Attorney, Agent, or Firm — Ditthavong & Steiner, P.C.

(57) ABSTRACT

A method of forming spacers and the resulting fin-shaped field effect transistors are provided. Embodiments include forming a silicon (Si) fin over a substrate; forming a polysilicon gate over the Si fin; and forming a spacer on top and side surfaces of the polysilicon gate, and on exposed upper and side surfaces of the Si fin, the spacer including: a first layer and second layer having a first dielectric constant, and a third layer formed between the first and second layers and having a second dielectric constant, wherein the second dielectric constant is lower than the first dielectric constant.

20 Claims, 5 Drawing Sheets

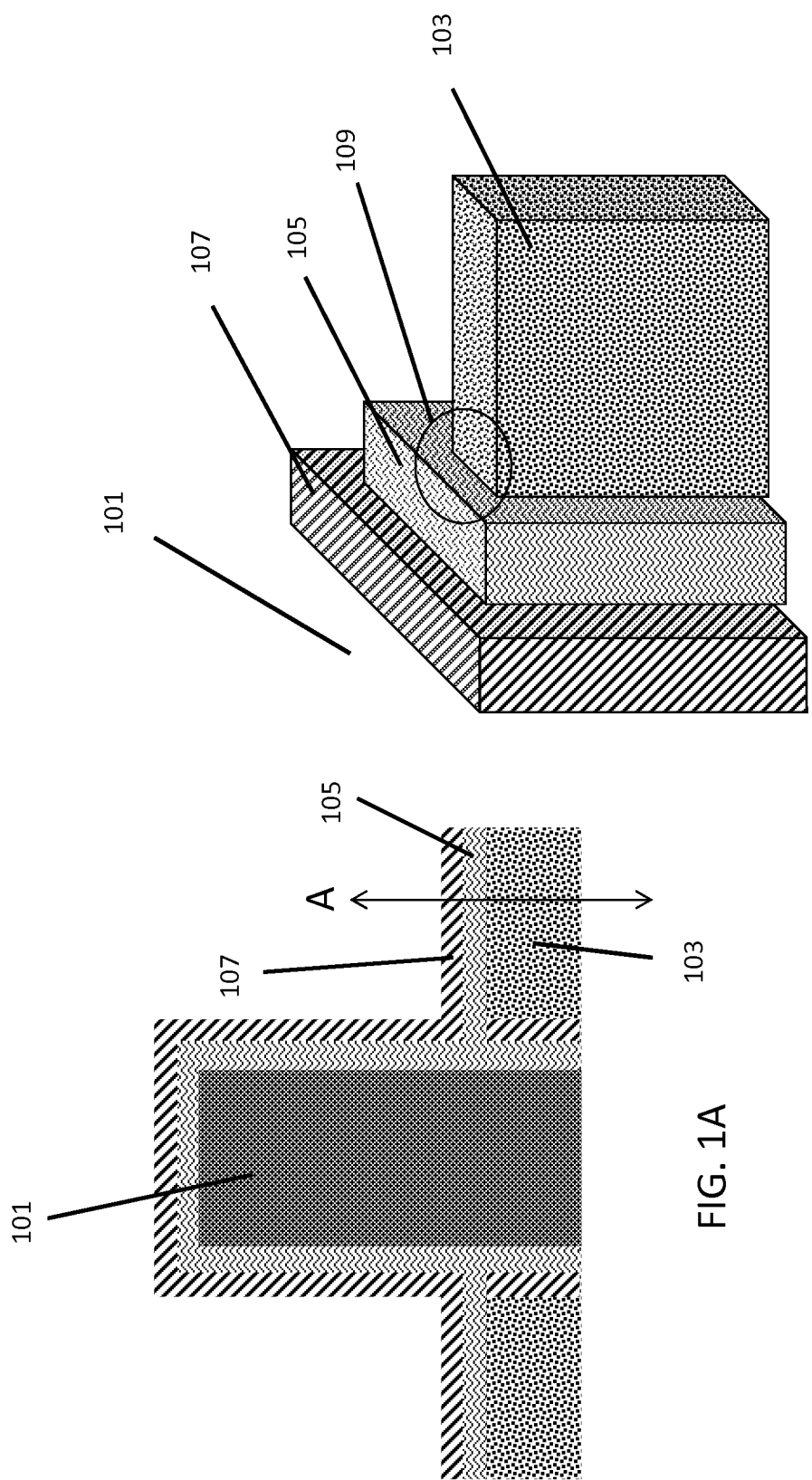

MULTI-LAYER SPACER USED IN FINFET

TECHNICAL FIELD

The present disclosure relates to the manufacture of semiconductor devices including the formation of spacers in a Fin-Shaped Field Effect Transistor (finFET). In particular, the present disclosure relates to forming spacers used in manufacturing a semiconductor device in the 14 nanometer (nm) technology node and beyond.

BACKGROUND

Shallow trench isolation (STI) voids are problematic in finFETs and are one of the top yield detractors. In a standard finFET design, gate material such as hafnium (Hf) and titanium (Ti) can be detected at a void located between a source/drain (S/D) material and the gate which can lead to a trench silicide-gate (TS-PC) short. As shown in FIG. 1A, a gate 101 and fin 103 are illustrated in a conventional finFET. Inner spacer 105 and outer spacer 107 are disposed at sides of the gate 101 and over the fin 103. FIG. 1B is a sectional view along arrow A. In the illustration of FIG. 1B, a failure can occur at a void within circle 109 which is located adjacent to the fin 103.

Bi-layer spacers on sides of the gate 101 and the fin 193 are used to prevent voids formed at weak points. Inner spacer 105 can include a dielectric material such a silicon nitride (SiN), and the outer spacer 107 can include a dielectric material such as an oxide. The outer spacer 107 is more prone to etching. Inner spacer 105 has a lower carbon percentage (C %) to achieve a lower dielectric constant to increase circuit speed. The outer spacer 107 has a high C % for improved resistance to various cleaning processes that result in spacer material loss.

In finFET technology, there are multiple processes during junction cleaning and replacement metal gate (RMG) cleaning, such as ashing, remote plasma assisted dry etch processing, or other cleaning processes, that can attack low-k dielectric materials such as the inner spacer 105. The inner spacer 105 is generally considered as a "weaker" material that has a much faster etch rate than the outer spacer 107. For example, the etch rate of the inner spacer 105 is 6× higher when a dilute hydrofluoric (DHF) acid etchant is used.

As shown in FIG. 2A, the gate 101 is disposed over the fin 103, with inner spacer 105 and outer spacer 107 disposed around the gate 101. During the junction cleaning, as shown in FIG. 2A, a void within circle 201 is formed at a weak point of the inner spacer 105. Moreover, during RMG processing following the removal of the polysilicon gate material, as shown in FIG. 2B, void 201 within circle 201 is also present. The challenge faced by the bi-layer spacer scheme is that the inner spacer 105 tends to be the weak point during cleaning and etching processes which results in a void that links the gate 101 and a S/D region.

A need therefore exists for methodology that provides a spacer with a low dielectric constant but a higher resistance to cleaning processes, and improves the performance of resulting devices.

SUMMARY

An aspect of the present disclosure includes a methodology for providing a spacer that achieves a balance between a spacer having a lower dielectric constant and higher resistance to various cleaning processes during finFET manufacturing which result in voids and deteriorates device performance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of forming a silicon (Si) fin over a substrate; forming a polysilicon gate over the Si fin; and forming a spacer on top and side surfaces of the polysilicon gate, and on exposed top and side surfaces of the Si fin, the spacer including: a first layer and second layer having a first dielectric constant, and a third layer formed between the first and second layers and having a second dielectric constant, wherein the second dielectric constant is lower than the first dielectric constant.

Aspects of the present disclosure include forming the spacer with atomic layer deposition (ALD). Another aspect includes forming the spacer to a minimum thickness of 2 to 3 Angstroms (Å). Further aspects include the first and second layers having a carbon percentage (C %) that is higher than a C % of the third layer. Other aspects include the first and second layers having a C % of 7 to 9%, and the third layer having a C % of 1 to 3%. Yet further aspects include forming of the spacer by: forming a fourth layer over the second layer; and forming a fifth layer over the fourth layer, wherein the fourth layer has the same dielectric constant as the third layer, and the fifth layer has the same dielectric constant as the first and second layers. Certain aspects include the fourth layer having a C % of 1 to 3% and the fifth layer having a C % of 7 to 9%. Still further aspects include removing the spacer from the exposed upper and side surfaces of the fin. Additional aspects include forming source drain regions on sides of the polysilicon gate. Further aspects include removing the polysilicon gate to form an opening between opposing spacers; and cleaning the opening. Yet another aspect includes forming a metal gate in the opening.

Another aspect of the present disclosure is device including a Si fin formed over a substrate; a gate stack formed over the Si fin; and a spacer formed on side surfaces of the gate stack, the spacer including: a first layer and second layer including a first low-k dielectric material, and a third layer formed between the first and second layers and including a second low-k dielectric material, wherein a dielectric constant of the second low-k material is lower than the first low-k dielectric material.

Aspects include the spacer being formed to a minimum thickness of 2 to 3 Å. Other aspects include the first and second layers have a C % that is higher than a C % of the third layer. Additional aspects include the first and second layers having a C % of 7 to 9%, and the third layer has a C % of 1 to 3%. In certain aspects the spacer further includes: a fourth layer formed over the second layer; and a fifth layer formed over the fourth layer, wherein the fourth layer includes a third low-k dielectric material, and the fifth layer includes a fourth low-k dielectric material, wherein a dielectric constant of the third low-k dielectric material is lower than the fourth low-k dielectric material. Still further aspects include the fourth layer having a C % of 1 to 3% and the fifth layer having a C % of 7 to 9%.

Yet another aspect includes a method including forming a Si fin over a substrate; forming a polysilicon gate over the Si fin; and forming a spacer on top and side surfaces of the polysilicon gate, and on exposed upper and side surfaces of the Si fin, wherein the spacer includes three or more alternating layers of a first low-k dielectric material and a second low-k dielectric material, with an innermost layer closest to the polysilicon gate comprising the first low-k dielectric material, and an outermost layer furthest from the polysilicon gate comprising the first low-k dielectric material, and wherein a dielectric constant of the second low-k dielectric material is lower than the first low-k dielectric material.

Certain aspects include at least one layer including the second low-k dielectric material is formed between the innermost and outermost layers. Other aspects include performing replacement metal gate processing of the polysilicon gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B illustrate a bi-layer spacer design in a conventional finFET;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of voids formed in bi-layer spacers by cleaning processes during finFET manufacturing. In accordance with embodiments of the present disclosure, a Si fin is formed over a substrate; a polysilicon gate is formed over the Si fin; and a spacer is formed on top and side surfaces of the polysilicon gate, and on an upper surface of the Si fin, the spacer including: a first layer and second layer having a first dielectric constant, and a third layer formed between the first and second layers and having a second dielectric constant, wherein the second dielectric constant is lower than the first dielectric constant.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2B:
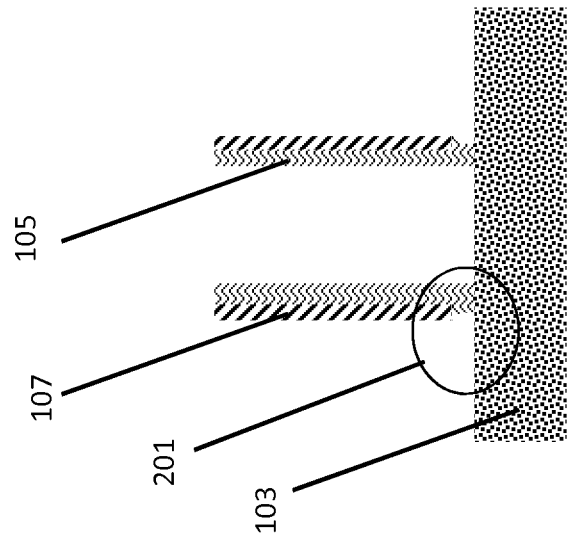
FIGS. 2A and 2B illustrate voids formed with a bi-layer spacer design in a conventional finFET.
Figure 2A:
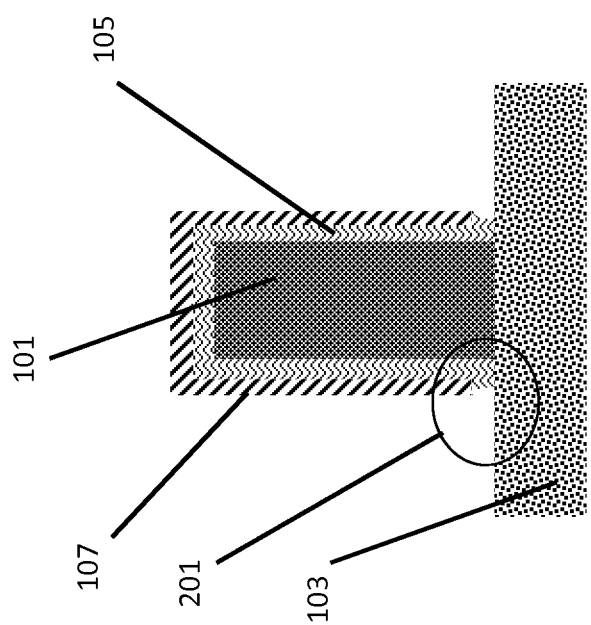
Figure 3:
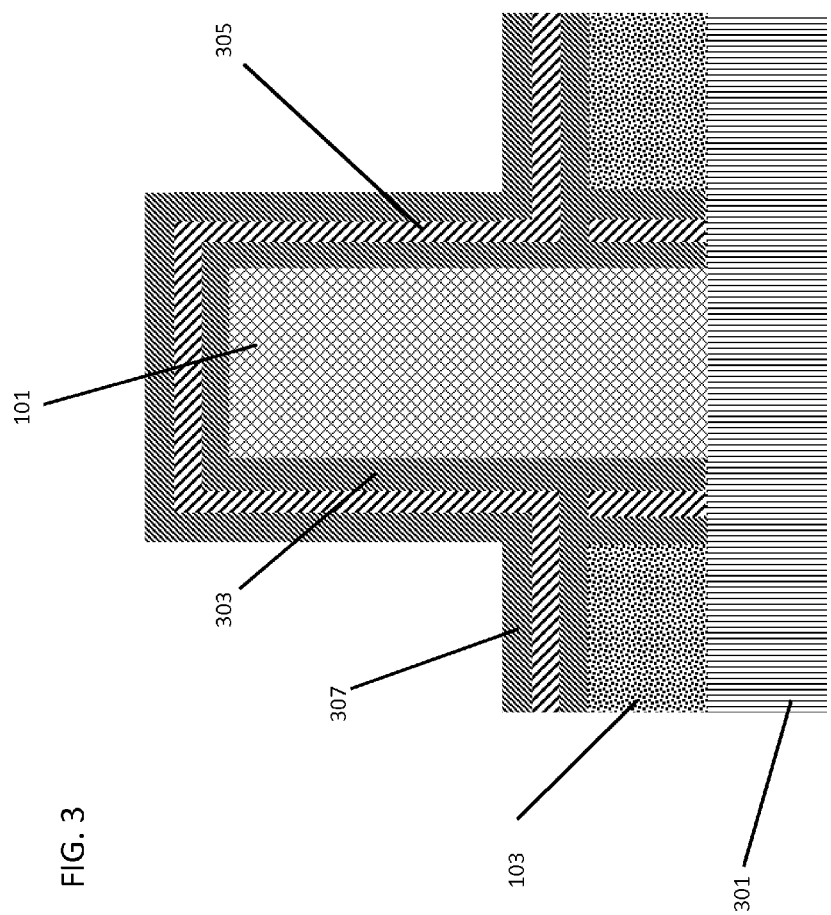
FIG. 3 illustrates in cross sectional view, a multi-layer spacer in a finFET, in accordance with an exemplary embodiment.

Adverting to FIG. 3, a polysilicon gate 101 is formed over the Si fin 103 which is formed over a substrate 301. A multi-layer spacer is deposited over top and side surfaces of the polysilicon gate 101, and on upper and side surfaces of the Si fin 103. Substrate 301 includes a Si substrate. Other examples of materials that may be suitable for use in the substrate 301 include silicon-on-insulator (SOI), silicon germanium (SiGe), germanium (Ge), and/or compound semiconductor materials. Processes, such as photolithography and etch processes, can be used to create the fins 103. The fins 101 may include Si. STI regions (not shown for illustrative convenience) are formed in the substrate 301 between adjacent fins 103. The STI is formed by etching a pattern of trenches in the substrate 301, depositing one or more dielectric materials (such as silicon dioxide) to fill the trenches, and removing the excess dielectric.

STI regions and fins 103 are formed by multi-layer hard mask deposition, STI/fin hard mask patterning, etching, photoresist stripping, Si-etching, oxide gap-fill, chemical mechanical polishing, annealing, and hard mask removal. Additionally, $n^+/p^+$ well patterning; $n^+/p^+$ implanting; and annealing are performed. The dummy gate stack is then formed by polysilicon deposition and patterning. The multi-layer spacer is then formed.

The multi-layer spacer in the example of FIG. 3 includes a first layer 303 and second layer 307 which have a first dielectric constant, and a third layer 305 formed between the first layer 303 and the second layer 307. The third layer 307 has a second dielectric constant that is lower than the first dielectric constant. The multi-layer spacer is formed to a minimum thickness of 2 to 3 Å with ALD. The first layer 303 and second layer 307 have a C % that is higher than a C % of the third layer 307. Moreover, the first layer 303 and the second layer 307 have a C % of 7 to 9%, and the third layer 305 has a C % of 1 to 3%.

Following the formation of the multi-layer spacer, halo implants are formed. In certain examples, epitaxially grown SiGe (for p-type source/drain) with in-situ or $p^+$ implant doping, and Si-epitaxy (for n-type raised source/drain) with in-situ $n^+$ implant doping are performed. Next, RMG formation is performed. An interlayer dielectric (ILD) is deposited followed by polysilicon open CMP; and polysilicon removal.

Figure 4:
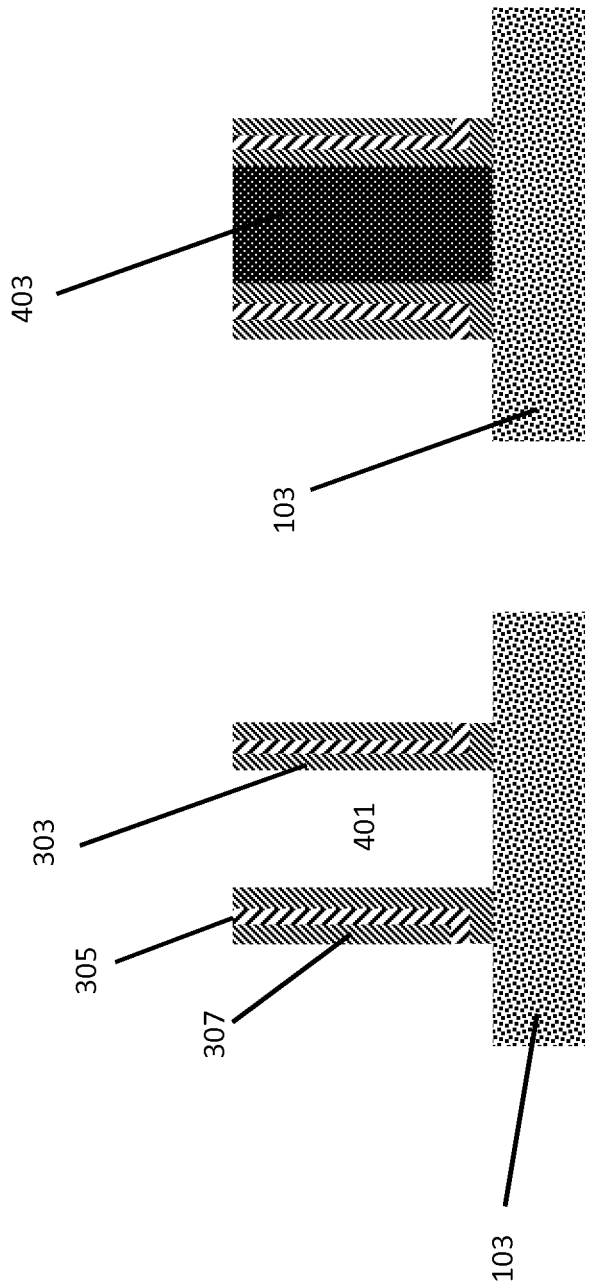
FIGS. 4A and 4B illustrates in cross sectional view, a multi-layer spacer during different cleaning processes, in accordance with an exemplary embodiment.

Adverting to FIG. 4A, following the removal of the polysilicon gate 101 and removal of the multi-layer spacer from the upper surface of the fin 103, a cleaning of an opening 410 between opposing spacers is performed to remove any residual polysilicon material. A metal gate 403 is then deposited in the opening and planarized.

Figure 5:
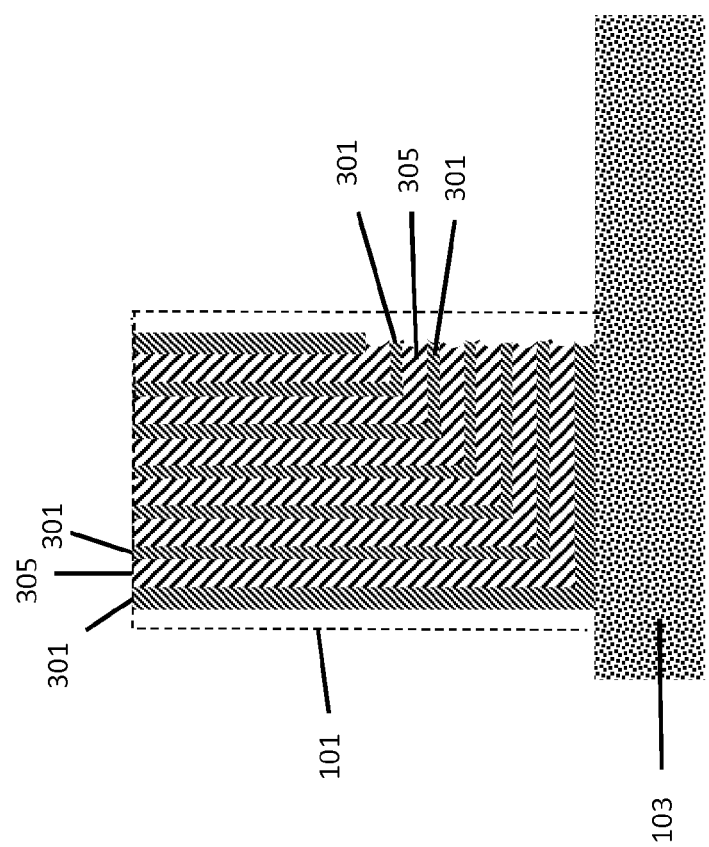
FIG. 5 illustrates a multi-layer spacer, in accordance with another exemplary embodiment.

Adverting to FIG. 5, an example of a multilayer spacer is illustrated. The multi-layer spacer includes multiple layers of "stronger" spacer layers 301 which contain a higher C %. The multi-layer spacer begins and ends with the spacer layers 301. The "weaker" spacer layers 303 are deposited between the "stronger spacer layers 301. The C % can be varied to a desired amount and not limited to any C % value. The C % can be varied to achieve a desired dielectric constant.

As shown in FIG. 5, a stronger, more resistant multi-layer spacer is achieved which better withstands cleaning processes because of the lower C % spacer layers being separated and supported by higher C % spacer layers. In addition, only the "weaker" spacer layers 303 extend away from the metal gate in a horizontal direction, while the outermost layer includes a "stronger" spacer layer 301 which extend vertically. During deposition of the spacer layers 301 and 303, since ALD is a conformal process, the layers are deposited to cover the whole surface of the polysilicon gate 101 and the fin 103, thereby resulting in an L-shaped arrangement illustrated in FIG. 5. The multi-layer spacer includes a minimum of three layers, as represented in FIG. 3, to three layers and beyond, as represented in FIG. 5. The multi-layer spacer scheme includes multiple dielectric constant layers which is not limited to two different materials. For example, the inner "weak" material can be replaced with an even "weaker" dielectric material in the center of the multi-layer spacer.

The embodiments of the present disclosure can achieve several technical effects, including a multi-layer spacer with different dielectric constants to achieve an ideal balance between a lower capacitance and more robust process. Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated complementary metal oxide silicon (CMOS) technologies, including finFETs in the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a silicon (Si) fin over a substrate;
   forming a polysilicon gate over the Si fin; and
   forming a spacer on top and side surfaces of the polysilicon gate, and on exposed upper and side surfaces of the Si fin, the spacer comprising:
      a first layer and second layer having a first dielectric constant, and
      a third layer formed between the first and second layers and having a second dielectric constant,
      wherein the second dielectric constant is lower than the first dielectric constant.
2. The method according to claim 1, comprising forming the spacer with atomic layer deposition (ALD).
3. The method according to claim 2, comprising forming the spacer to a minimum thickness of 2 to 3 Angstroms (Å).
4. The method according to claim 1, wherein the first and second layers have a carbon percentage (C %) that is higher than a C % of the third layer.
5. The method according to claim 4, wherein the first and second layers have a C % of 7 to 9%, and the third layer has a C % of 1 to 3%.
6. The method according to claim 1, wherein the forming of the spacer further comprises:
   forming a fourth layer over the second layer; and
   forming a fifth layer over the fourth layer,
   wherein the fourth layer has the same dielectric constant as the third layer, and the fifth layer has the same dielectric constant as the first and second layers.
7. The method of claim 6, wherein the fourth layer has a C % of 1 to 3% and the fifth layer has a C % of 7 to 9%.
8. The method according to claim 1, further comprising:
   removing the spacer from the upper and side surfaces of the fin.
9. The method according to claim 1, further comprising:
   forming source drain regions on sides of the polysilicon gate.
10. The method according to claim 9, further comprising:
    removing the polysilicon gate to form an opening between opposing spacers; and
    cleaning the opening.
11. The method according to claim 10, further comprising:
    forming a metal gate in the opening.
12. A device comprising:
    a silicon (Si) fin formed over a substrate;
    a gate stack formed over the Si fin; and
    a spacer formed on side surfaces of the gate stack,
    the spacer comprising:
       a first layer and second layer including a first low-k dielectric material, and
       a third layer formed between the first and second layers and including a second low-k dielectric material, wherein a dielectric constant of the second low-k material is lower than the first low-k dielectric material.
13. The device according to claim 12, the spacer is formed to a minimum thickness of 2 to 3 Angstroms (Å).
14. The device according to claim 12, wherein the first and second layers have a carbon percentage (C %) that is higher than a C % of the third layer.
15. The device according to claim 14, wherein the first and second layers have a C % of 7 to 9%, and the third layer has a C % of 1 to 3%.
16. The device according to claim 12, wherein the spacer further comprises:
    a fourth layer formed over the second layer; and
    a fifth layer formed over the fourth layer,
    wherein the fourth layer includes a third low-k dielectric material, and the fifth layer includes a fourth low-k dielectric material, wherein a dielectric constant of the third low-k dielectric material is lower than the fourth low-k dielectric material.
17. The device according to claim 16, wherein the fourth layer has a C % of 1 to 3% and the fifth layer has a C % of 7 to 9%.
18. A method comprising:
    forming a silicon (Si) fin over a substrate;
    forming a polysilicon gate over the Si fin; and
    forming a spacer on top and side surfaces of the polysilicon gate, and on exposed upper and side surfaces of the Si fin,
    wherein the spacer comprises three or more alternating layers of a first low-k dielectric material and a second low-k dielectric material, with an innermost layer closest to the polysilicon gate comprising the first low-k dielectric material, and an outermost layer furthest from the polysilicon gate comprising the first low-k dielectric material, and wherein a dielectric constant of the second low-k dielectric material is lower than the first low-k dielectric material.

19. The method according to claim 18, wherein at least one layer including the second low-k dielectric material is formed between the innermost and outermost layers.

20. The method according to claim 18, further comprising:

performing replacement metal gate processing of the polysilicon gate.

\* \* \* \* \*